(12) United States Patent
Golan et al.

(10) Patent No.: US 6,377,048 B1
(45) Date of Patent: Apr. 23, 2002

(54) MAGNETIC RESONANCE IMAGING DEVICE FOR OPERATION IN EXTERNAL STATIC MAGNETIC FIELDS

(75) Inventors: Erez Golan, Tel Aviv; Aharon Blank, Kiriat Ono; Gil Alexandrowicz, Jerusalem, all of (IL)

(73) Assignee: TopSpin Medical (Israel) Limited, Lod (IL)

( * ) Notice: Subject to any disclaimer, the term of this patent is extended or adjusted under 35 U.S.C. 154(b) by 0 days.

(21) Appl. No.: 09/707,905

(22) Filed: Nov. 8, 2000

(51) Int. Cl.[7] ................................................ G01V 3/00
(52) U.S. Cl. ...................................... 324/318; 324/322
(58) Field of Search ................................ 324/318, 322, 324/306, 307, 309, 312, 314, 300

(56) References Cited

U.S. PATENT DOCUMENTS

| | | | |
|---|---|---|---|
| 4,572,198 A | * | 2/1986 | Codrington ................. 128/653 |
| 5,050,607 A | | 9/1991 | Bradley et al. |
| 5,194,809 A | * | 3/1993 | Lew ........................... 324/309 |
| 5,303,707 A | * | 4/1994 | Young ........................ 324/309 |
| 5,307,814 A | | 5/1994 | Kressel et al. |
| 5,365,928 A | | 11/1994 | Rhinehart et al. |
| 5,476,095 A | | 12/1995 | Schnall et al. |
| 5,572,132 A | | 11/1996 | Pulyer et al. |
| 5,699,801 A | | 12/1997 | Atalar et al. |

OTHER PUBLICATIONS

Callaghan, "Principles of Nuclear Magnetic Resonance Microscopy", Oxford Science Publications, pp. 173–201, (1995).

* cited by examiner

Primary Examiner—Louis Arana
(74) Attorney, Agent, or Firm—Browdy and Neimark

(57) ABSTRACT

An MRI system is presented utilizing a magnetic assembly of a kind which, when accommodated within a primary static reasonably homogeneous magnetic field created by the MRI system affects the static magnetic field to cause creation of a region of substantial non-homogeneity of the static magnetic field in the vicinity of the magnetic assembly. By this, a local static field gradient is created. The magnetic assembly comprises a passive magnetic element, which deforms a pattern of the static magnetic field, while not being a magnetic field source by to itself.

33 Claims, 10 Drawing Sheets

MAGNETIC RESONANCE IMAGING DEVICE FOR OPERATION IN EXTERNAL STATIC MAGNETIC FIELDS

FIELD OF THE INVENTION

This invention is generally in the field of Nuclear Magnetic Resonance (NMR) based techniques, and relates to a device and method for magnetic resonance imaging (MRI). Although not limited thereto, the invention is particularly useful for medical purposes, to acquire images of cavities in a human body, but may also be used in any industrial application.

BACKGROUND OF THE INVENTION

MRI is a known imaging technique, used especially in cases where soft tissues are to be differentiated. Alternative techniques, such as ultrasound or X-ray based techniques, which mostly utilize spatial variations in material density, have inherently limited capabilities in differentiating soft tissues.

NMR is a term used to describe the physical phenomenon in which nuclei when placed in a static magnetic field, respond to a superimposed alternating (RF) magnetic field. It is known that when the RF magnetic field has a component perpendicular in direction to the static magnetic field, and when this component oscillates at a frequency known as the resonance frequency of the nuclei, then the nuclei can be excited by the RF magnetic field. This excitation is manifested in the temporal behavior of nuclear magnetization following the excitation phase, which in turn can be detected by a reception coil and termed the NMR signal. A key element in the utilization of NMR for imaging purposes is that the resonance frequency, known as the Larmor frequency has a linear dependence on the intensity of the static magnetic field in which the nuclei reside. By applying a static magnetic field, of which the intensity is spatially dependent, it is possible to differentiate signals received from nuclei residing in different magnetic field intensities, and therefore in different spatial locations. The techniques, which utilize NMR phenomena for obtaining spatial distribution images of nuclei and nuclear characteristics, are termed MRI.

In conventional MRI techniques, spatial resolution is achieved by superimposing a stationary magnetic field gradient on a static homogeneous magnetic field. By using a series of excitations and signal receptions under various gradient orientations a complete image of nuclear distribution can be obtained. Furthermore, it is a unique quality of MRI that the spatial distribution of chemical and physical characteristics of materials, such as biological tissue, can be enhanced and contrasted in many different manners by varying the excitation scheme, known as the MRI sequence, and by using an appropriate processing method.

The commercial application of MRI techniques suffers from the following two basic drawbacks: the expenses involved with purchasing and operating an MRI setup; and the relatively low signal sensitivity which requires long image acquisition time. Both of these drawbacks are linked to the requirement, in standard MRI techniques, to image relatively large volumes, such as the human body. This necessitates producing a highly homogeneous magnetic field and field gradients over the entire imaged volume, leading to extensive equipment size. Additionally, the unavoidable distance between a signal receiving coil and most of the imaging volume significantly reduces imaging sensitivity.

In order to better understand the inter-relation between hardware limitations and the characteristics of the obtained image, the typical MRI system components are described below in more detail. Such a system must include at least the following four components; (1) a strong static (DC) magnetic field source creating the primary static substantially homogeneous magnetic field in the entire volume to be imaged; (2) a transmission antenna (coil) and a transmission channel for transmitting No excitation pulses; (3) a reception antenna (coil) and a receiving channel for receiving the so-excited NMR signal; and (4) a magnetic field gradient source to spatially encode-the signals originating from the imaged volume.

The resolution of an image depends on many parameters, some of which are related to the imaging hardware, and some relate to the imaging technique or pulse-sequence used. Practically, however, the resolution is generally governed by two parameters: gradient field strength and signal to noise ratio (SNR) per volume cell (voxel).

It is known and disclosed for example in "*Principles of Nuclear Magnetic Resonance Microscopy*", P. T. Callaghan, Oxford Science Publications, 1995, that in a noise-free (ideal) setting for 2-D Fourier spin-echo imaging, if the required resolution in the gradient dimension is Δx, then the resolution requirement can be written as follows:

$$\gamma \cdot G_{max} \cdot \Delta x \cdot T_{grad} \approx \pi$$

wherein $\gamma$ is the gyromagnetic ratio, $G_{max}$ is the maximum achievable gradient (in Tesla/m) and $T_{grad}$ is the gradient pulse length. For typical gradient pulse lengths of about 1 msec (limited by signal decay, etc.), the required $G_{max}$ for a resolution of about 0.5×0.5 mm is about 2–3 Gauss/cm. It tuns out that these high gradient values are hard to achieve over large volumes (typically 50×50×50 cm), especially since large gradient coils having large inductance values are reluctant to develop large currents over short periods of time. Moreover, creating high field gradients over large portions of the patient's body can induce discomforting and even dangerous nerve activation, let alone unbearable acoustic noise during gradient transmission coming from the MRI machine itself.

The other factor that governs the resolution limit is the SNR per voxel, which is strongly related to reception coil sensitivity. Conventional, MRI machines have the reception antennas (coils) installed in the main body of the machine, and thus geometrically far from internal organs, which need to be imaged. This problem has been addressed in the past and partially solved by some remarkable innovations, disclosed for example in U.S. Pat. Nos; 5,699,801; 5,476,095; 5,365,928; 5,307814 and 5,050,607. Generally, these innovations consist of using an application-specific reception coil to be located in the vicinity of the tissue to be imaged (sometimes external and sometimes internal to the body), thus increasing receiving sensitivity, SNR and, eventually, the image resolution.

U.S. Pat. No. 5,572,132 discloses a concept of combining the static magnetic field source with the RF coil in a self contained intra-cavity medical imaging probe. Here, several permanent magnet configurations are proposed for creating a homogeneous magnetic field region external to the imaging probe itself, and several RF and gradient coil configurations that may be integrated in the imaging probe in order to allow autonomous imaging capabilities. The limitations of the autonomous probe of U.S. Pat. No. 5,572,132 are the fact that the imaging technique still requires a region of substantially homogeneous field, which, unfortunately, can be created in a very limited volume externally to the probe itself limiting a field of view (FOV) of the device, and the fact that the static field values created in this very limited region are substantially low. This limitation stems mostly from the fact that the static field sources can create sufficiently strong static magnetic field in a listed region around them. Further away from the magnets the static field strength drops significantly, up to a point where there is no sufficient SNR per voxel, and therefore no imaging feasibility. These limitations make it practically impossible to use the device for imaging, as opposed to measurement, purposes.

The use of a portable receiver coil in conjunction with external MRI machines (as disclosed in the above-mentioned U.S. Pat. Nos. 5,699,801; 5,476,095; 5,365,928; 5,307814 and 5,050,607) is not subject to this limitation, because the external field sources are capable of creating very strong magnetic field (typically 0.5 to 4 Tesla in medical imaging) over very large volumes (again: typically 50×50×50 cm's). Although the receiver sensitivity "barrier" is lifted by using an internal coil, other problems, such as difficulty and limitations in producing strong gradient fields over large volumes, together with the high cost of the external MRI setup, still hinder the application of this concept from becoming straightforward. In addition, although the SNR limitation is practically overcome by the portable coil systems, the gradient intensity limitation (due to either hardware difficulties or patient discomfort) still remains.

The conventional MRI setup typically utilizes expensive and complicated hardware means for creating a substantially homogeneous static magnetic field. The operation with such homogeneous static magnetic field allows operating in a narrow frequency bandwidth (typically a few Hz), which results in low noise or, rather, high signal to noise ratio (SNR) per spin-echo; the duration of which can be a few milliseconds. In this conventional scheme a relatively small number of such spin-echo signals (typically a few such signals) can be acquired during one excitation series, the duration of which is roughly limited by a typical spin transverse relaxation tire (known as $T_2$).

SUMMARY OF THE INVENTION

There is accordingly a need in the art to facilitate high-resolution magnetic resonance imaging by providing a novel imaging device and method, as well as an MRI system utilizing the same, enabling to overcome external gradient field limitations. The present invention provides for combining the simplicity and low cost of a totally autonomous probe, with the ability to image larger volumes around the probe, without compromising high-resolution.

The present invention takes an advantage of the ability to operate in a substantially non-homogeneous static magnetic field, as long as the wideband reception and transmission channels are used, as well as specifically designed excitation pulse sequences. These provisions make it possible to achieve high SNR, which is similar to that achievable by the conventional MRI technique, by accumulating a large number of wide-bandwidth short duration echoes, in a similar overall acquisition time. This concept and devices utilizing the same are disclosed in co-pending applications assigned to the assignee of the present application. Generally speaking, according to this concept, the non-homogeneity of the static field created externally to the probe is used, rather than avoided, as a means for creating a gradient field inherently superimposed on a static field. The conventional spin-echoes excitation scheme is thus based on the use of a substantially non-homogeneous static field patterns which, on the one hand, increases the bandwidth, but, on the other hand, allows the accumulation of a large number of spin-echoes for averaging and SNR improvement. The scheme therefore allows substantially strong field gradients to be operated without losing the overall SNR, creating optimal conditions for high image resolution.

The main idea of the present invention is based on using a novel magnetic assembly (that may be a separate element or a part of an autonomous imaging device (probe)), in conjunction with external static field sources typically used in MRI systems. This magnetic assembly is of a kind that, when being accommodated within a primary static reasonably homogeneous magnetic field, it deforms the static magnetic field pattern to cause the creation of a region of substantial non-homogeneity of the static magnetic field in the vicinity of the magnetic assembly. Thus, the magnetic assembly creates a local static field gradient around the magnetic assembly, and, by moving the magnetic assembly within the entire static field region created by the external source, a FOV of the entire MRI system is moved from region to region.

The term "reasonably homogeneous magnetic field" used herein signifies a field, whose original nonhomogeneity (prior to being affected by the magnetic assembly) in the intended vicinity of the assembly is negligible as compared to the non-homogeneity of the magnetic field as created by this assembly.

It is important to note that the magnetic assembly according to the invention deforms the static magnetic field pattern created by an external magnetic field source without creation of any additional magnetic field. In other words, the magnetic assembly is a passive element that affects (deforms) the static magnetic field pattern.

As indicated above, the magnetic assembly may be a part of the imaging probe, in which case transmission, reception and gradient coils are preferably integrated in the probe itself, while the primary static field is produced by external sources.

The imaging device according to the invention is a partially autonomous MRI probe, which can be applied to local imaging of an extensive region located externally to the probe in a static reasonably homogeneous magnetic field. The probe in such application is preferably integrated in a surface exploring or a minimally invasive device such as a catheter, which is connected to an external imaging console. The device according to the invention comprises a novel magnetic assembly, and preferably integrates all components necessary to allow magnetic resonance measurements and imaging of local surroundings of the magnetic assembly (i.e., field sources and antennas), except for an external source creating a reasonably homogeneous static magnetic field in the imaging volume. The device can be used for surface imaging or internal body imaging by insertion to the body using a catheter.

An MRI system according to the invention utilizes a primary static magnetic field source of a kind used in the conventional MRI systems (only with more lenient restrictions on field homogeneity), and an imaging device (probe) incorporating or preferably associated with other electromagnetic assemblies of the system.

Since a distortion of the external magnetic field created by the magnetic assembly is made in a well-defined manner, i.e., the resulting field pattern enables spatial mapping of each component of the received NMR signal, then it can be used as a local gradient field added to the otherwise homogeneous external field. The distortion can be made very intense, meaning a substantially high field gradient, but also very local, meaning over a relatively small volume (compared to the entire homogeneous field region) in probity to the distortion assembly. This way, the limitations associated with the generation of field gradients over larger volumes are overcome.

To create a basic local gradient of tie static magnetic field (i.e., separation in first dimension), the imaging probe may comprise a ferromagnetic material of a specific geometry creating constant distortion, or a special gradient coil may be located at the imaging probe itself. An additional gradient creating separation in the second dimension is preferably implemented by a gradient coil, since the gradient must be time varying. Additional gradient coils may be added to create separation in the third dimension The present invention, therefore, provides a means for obtaining substantially high resolution MR images of a substantially extensive region in proximity to a magnetic field deforming assembly, while greatly reducing the homogeneity requirements for the externally produced static field, therefore greatly to reducing its cost.

An imaging method according to the invention is based on the use of a substantially non-homogeneous static magnetic field (created by the local probe-produced distortion in the static magnetic field) and on the use of wideband reception and transmission channels and pulse sequences specifically designed to make use of the substantially non-homogeneous static magnetic field.

There is thus provided according to one aspect of the present invention, a magnetic assembly for use in an MRI system, the magnetic assembly being of a kind which, when accommodated within a primary static reasonably homogeneous magnetic field, affects the static magnetic field to cause creation of a region of substantial non-homogeneity of the static magnetic field in a medium in the vicinity of the magnetic assembly, thereby creating a local static field gradient, which can be used for imaging.

The magnetic assembly may be in the form of a rod or sphere made of a ferromagnetic material. The region of non-homogeneous static magnetic field is in the form of a slice surrounding the magnetic assembly.

According to another aspect of the present invention, there is provided an MRI system comprising a first magnetic field source creating a primary static reasonably homogeneous magnetic field in a medium, a second magnetic field source creating a time-varying magnetic field in a region of said primary static reasonably homogeneous magnetic field to excite nuclei in the medium to generate NMR signals, and a receiver for receiving the NMR signals and generating data indicative thereof, wherein said MRI system comprises a magnetic assembly which, when being accommodated within said region of primary static reasonably homogeneous magnetic field, affects the static magnetic field pattern to cause creation of a region of substantial non-homogeneity of the static magnetic field in the vicinity of the magnetic assembly, thereby creating a local static field gradient, a field of view of the MRI system being defined by a region of the local static field gradient.

According to yet another aspect of the present invention, there is provided an imaging device for use with an external magnetic field source that creates a primary static substantially homogeneous magnetic field, the device comprising:

a magnetic assembly of a kind which, when accommodated within said primary static reasonably homogeneous magnetic field, affects the static magnetic field to cause creation of a region of substantial non-homogeneity of the static magnetic field in a medium in the vicinity of the magnetic assembly;

a magnetic field source for creating a time-varying magnetic field, which, when being applied to said region, is capable of exciting nuclei in at least a part of said region to generate NMR signals; and a receiver for receiving the NMR signals and generating data indicative thereof.

The time-varying magnetic field source is in the form of at least one radio-frequency (RF) transmitting coil. The transmitting coil may be wound onto a rod-like magnetic assembly, in which case it excites nuclei within a circumferential region of the non-homogeneous static magnetic field (i.e., slice). Alternatively, the transmitting coil may be mounted adjacent to the rod-like magnetic assembly, such that the coil extends along an axis perpendicular to the longitudinal axis of the rod. In this case, the coil excites nuclei in a sector of the slice-like region of non-homogeneous static magnetic field.

The data generated by the receiver is received and processed in a control unit having suitable electronics and data processing means. The electronics generally comprises the following utilities:

1. A receiver channel, which includes tuning/matching components and several amplification stages of the received NMR signal, until it is finally digitized in the imaging console;
2. A transmission channel, which includes a D/A, a high-power amplifier and tuning/matching components to the transmission coil;
3. A gradient generator unit for generating gradient field pulses of the time-varying magnetic field at the required levels; and preferably
4. A motor unit for rotating the imaging probe about its longitudinal axis in order to create two-dimensional images, and, preferably, also for moving the probe along the longitudinal axis thereof in order to obtain three-dimensional images, for example, of segments of a blood vessel wall.

As indicated above, the imaging device according to the invention may be a fully autonomous probe device incorporating all necessary electromagnetic field and field-distortion sources, as well as a receiver coil, except for the static magnetic field source, which is produced externally. The autonomous probe device is further connected to an external imaging console, which together form a complete imaging system, integrating all the above electronic components.

The external imaging console (control unit) preferably comprises a personal computer (PC) having appropriate hardware operated by software for producing analog transmission signals, recording digitally the received spin-echo signals, processing the signals into images and displaying the obtained images on the PC monitor.

Thus, according to yet another aspect of the present invention, there is provided an MRI system comprising an external magnetic field source that creates a primary static substantially homogeneous magnetic field, an imaging probe device, and a control unit for receiving and analyzing data generated by the probe device to create images of a region of interest, wherein said imaging probe device comprises:

a probe portion having a magnetic assembly of a kind which, when accommodated within said primary static reasonably homogeneous magnetic field, affects the static magnetic field to cause creation of a region of substantial non-homogeneity of the static magnetic field in a medium in the vicinity of the probe portion;

a magnetic field source for creating a time-varying magnetic field, which, when being applied to said region, is capable of exciting nuclei in at least a part of said region to generate NMR signals; and a receiver for receiving the NMR signals and generating data indicative thereof.

According to yet another aspect of the invention, there is provided a method for magnetic resonance imaging of a region of interest in a medium, said region of interest lying within a region a primary, static, reasonably homogeneous magnetic field, the method comprising the steps of:

(i) affecting said primary, static, reasonably homogeneous magnetic field with a magnetic assembly, so as to create a region of substantial non-homogeneity of the static magnetic field in the region of interest;

(ii) applying a time-varying magnetic field to at least a part of said region of interest to excite nuclei therein for generating NMR signals;

(iii) receiving the NMR signals and generating data indicative thereof, (iv) analyzing the generated data to obtain an image of said region of interest.

Preferably, the time-varying magnetic field is capable of efficiently and simultaneously exciting nuclei characterized by a frequency bandwidth of more than 1% of a mean value of a magnetic resonance frequency for the nuclei.

The time-varying magnetic field created by the second magnetic field source has sufficiently high intensity and sufficiently wide frequency band, such that it is capable of efficiently and simultaneously exciting nuclear spins to generate NMR signals characterized by NMR frequency bandwidth of more than 1% (generally, 5%–200%, typically about 10%) of their mean frequency value. It should be understood that the term "simultaneous excitation" signifies excitation by a single pulse. Accordingly, the receiving of NMR signals is carried out with similar sufficiently high sensitivity and sufficiently wide frequency band.

The technique of the present invention thus consists of the following. A sample or body (or body part) to be imaged is placed in the static external magnetic field. The imaging device is connected to the external imaging console, and at least a probe portion of the device having the magnetic assembly that affects (deforms) the static magnetic field is brought to the vicinity of the ROI, by any known procedure, such as catheterization, surface scan, etc. When the static field-affecting magnetic assembly is located adjacent to the ROI, an operator initiates the imaging process via the imaging console controls. Imaging of the ROI is made possible in the following way:

The magnetic assembly affecting the static magnetic field actually deforms the magnetic field lines of the reasonably homogeneous static magnetic field, thereby creating a static non-homogeneous magnetic held region of a monotonic profile of sufficient absolute and gradient strength within the region of interest (ROI), which is external to the probe portion, and is in the form of a slice surrounding the probe portion. The exact geometry of the deformation depends on the geometry and properties of both external static field and magnetic assembly, and on their relative position and orientation thereof.

The time-varying magnetic field source (e.g., a transmission coil) is used to excite the nuclei located in the ROI, while the receiver (e.g., a coil) is used to receive the NMR signal (typically spin-echo) produced by the nuclei.

In order to produce a two-dimensional image of the ROI, two magnetic field gradients are used: The first gradient is inherent in the deformed static magnetic field, which generally changes substantially when moving radially away from the edge of the imaging probe (magnetic assembly). The second gradient is time-dependent and is generally directed perpendicular to the radial gradient i.e., the angle direction.

The time-varying gradient can be produced by any known suitable technique. For example, transmission coil designs disclosed in co-pending applications assigned to the assignee of the present application.

In order to produce a two-dimensional image of the ROI, a sequence of excitation pulses, preferably a multiple spin-echo sequence, such as the well-known CPMG, is transmitted by the transmission coil. This sequence has the advantage that a large number of spin-echoes can be recorded during a time frame of signal coherence, even at substantial static and RF field gradients.

Excitation of the ROI is preferably done by dividing the slice-like ROI into sub-regions, such that each sub-region includes nuclei corresponding to a specific resonance frequency band. Different subregions are generally located at different radial distances from the probe edge. Therefore, in order to excite a specific sub-region, the carrier frequency of each transmission pulse burst is determined according to the specific resonance frequency of the nuclei residing in that sub-region. By stepping the carrier frequency from one pulse burst to the next, the entire ROI can be scanned. Using extremely short pulses of sufficient power allows each sub-region to be substantially wide, meaning that a single pulse can excite nuclei in a substantially wide radial distance. Therefore, an image of the ROI can be acquired by a few pulse bursts.

The NMR signal received in each spin echo can be readily transformed into a one-dimensional density profile (neglecting NMR relaxation and diffusion effects) of the nuclei in the excited sub-region, along a radial vector. This is because each echo is acquired under a static (inherent) radial field gradient For obtaining two-dimensional images, an angular gradient coil can be used, which may be of any known kind, for example such as disclosed in co-pending application assigned to the assignee of the present application.

The main conceptual novelty of this invention is that by combination of an external high-intensity static field and an internally produced local field gradient (by means of an internal field deforming imaging probe), a region is created in the local surroundings of the probe, which is characterized by substantially high field gradients, which allow high-resolution images of this region to be obtained. The use of internally produced gradients eliminates the disadvantages of external gradient coils with their acoustic noise and nerve irritation. Additionally, the substantial field gradient values created by the probe, allow homogeneity requirements from the external field source to be greatly reduced. If, in addition, the receiver coil is integrated in the probe, then a substantially high SNR is achievable, again allowing substantially high-resolution images to be obtained. In addition, the imaged FOV is substantially extensive, relatively to the dimensions of the imaging probe, and to dimensions of FOV created by the prior art totally autonomous probe.

Furthermore, the invented concept allows the production of local high-resolution images using relatively low-cost setup (probe, imaging console and a source of external static field, which for the purposes of the present invention may be substantially less homogeneous than as required for the conventional MRI techniques).

BRIEF DESCRIPTION OF THE DRAWINGS

In order to understand the invention and to see how it may be carried out in practice, a preferred embodiment will, now be described, by way of non-limiting example only, with reference to the accompanying drawings, in which.

DETAILED DESCRIPTION OF A PREFERRED EMBODIMENT

Figure 1:
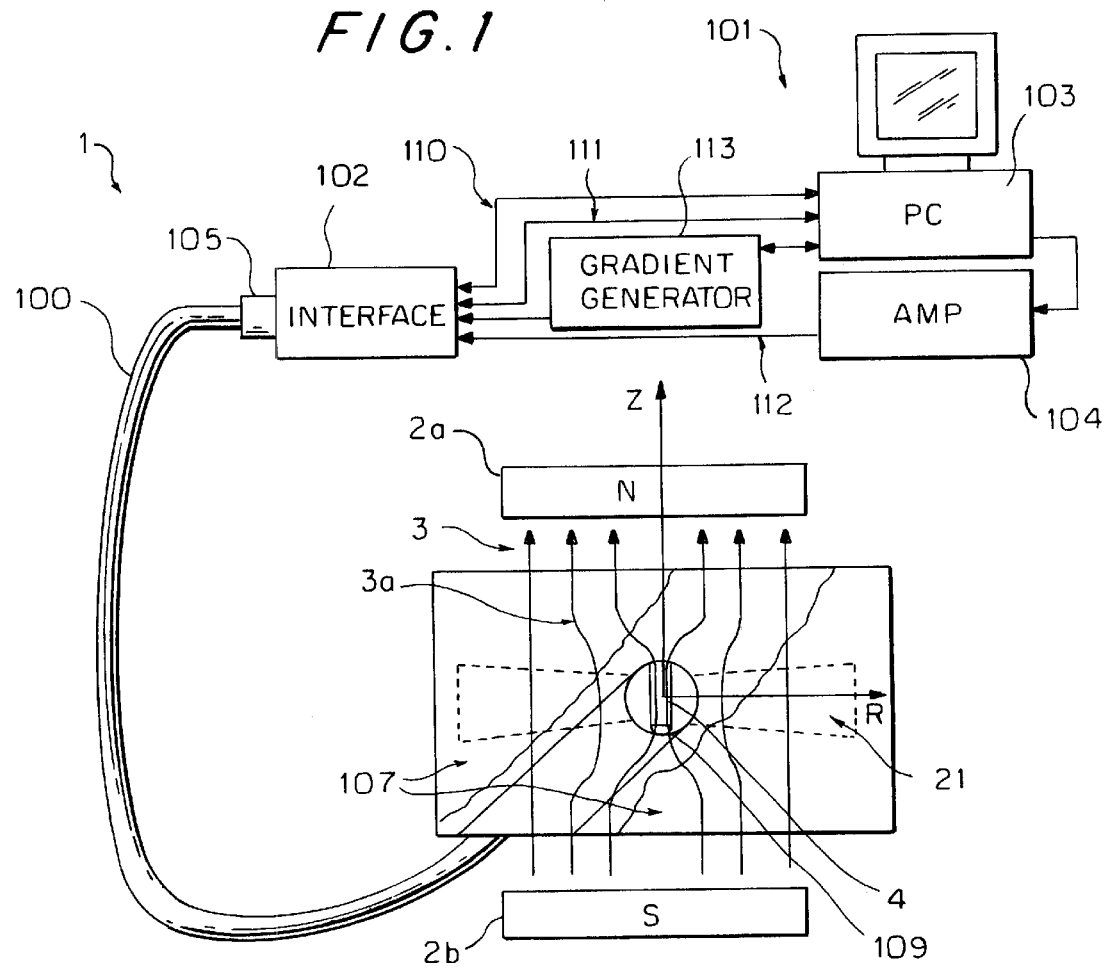
FIG. 1 is a schematic illustration of an MRI system according to the invention.

Referring to FIG. 1, there is illustrated an MRI system 1 according to the invention for high-resolution imaging. The system 1 is associated with a static magnetic field forming assembly 2, which may and may not be a part of the system 1. The system 1 is composed of such main components as an imaging device 100 and an imaging console 101, to which the device 100 is connected while performing the imaging.

In the present example, the assembly 2 is composed of two magnetic pole: pieces 2a and 2b. It should, however, be understood that numerous other static magnetic field sources known in the art could be used for the same purpose, such as electromagnets (superconducting or other), permanent magnets, etc. The pole pieces 2a and 2b create a substantially high and basically homogeneous static magnetic field within an air gap between them.

The imaging device 100 has a probe section 109, preferably located at its distal end, which houses an imaging probe 4. The construction and operation of the imaging probe 4 will be described more specifically further below.

The system 1 generally operates in the following manner: A patient or his body part (not shown) is positioned in between the magnetic pole pieces 2a and 2b(or in a static magnetic field created by any alternative method). The pole pieces 2a and 2b create a static magnetic field, the flux lines 3 of which are generally directed along the Z-axis. When the probe section 109 (i.e., the imaging probe 4) is located in the static magnetic field, i.e., between the pole pieces 2a and 2b, the probe 4 creates a deformation 3a in the original pattern of the static magnetic field flux lines 3. This is implemented by providing the imaging probe with a magnetic field disturbing assembly, as will be described further below. The deformation 3a is created only in the vicinity of the probe 4, but is substantial with respect to the original field pattern 3. A region 21 where the deformation of the static field is substantial with respect to the original field pattern 3 is defined as the imaging slice surrounding the probe 4. The slice like region 21 presents a region of interest (ROI) that can be imaged at a current position of the probe with respect to the patient's body part to be imaged.

In the present example relating to intra-vascular imaging applications, the region of interest 21 is located inside the patient's body, such as blood vessel walls 107. To His end, the imaging device 100 is of a kind insertable into the patient's body (not shown) by a minimally invasive technique. Alternatively, the imaging device may be brought to the vicinity of the body surfaces, such as the skin, the eye, etc. The deformation 3a in the field pattern creates substantially intense field gradients in vicinity to the probe section 109 which enable high resolution imaging of the local surroundings of the probe section 109 (e.g., the vessel walls 107).

The imaging device 100 may further comprise a radio-frequency (RF) transmitting coil (constituting a time-varying magnetic field source) together with a transmission channel, and a receiver coil together with a receiving channel, which are not specifically shown here. The transmitting channel and coil produce NMR excitation pulses and the receiver channel and coil receive NMR signals coming from within the imaging slice 21. It should be noted that either one of these elements or both of them may be incorporated in the imaging probe 4. Alternatively, either transmission or reception or both, may be done externally using any appropriate design available in the art, provided that the required bandwidth of operation and sensitivity requirements are met. In the present example, both transmission and reception coils are integrated in the probe device 4 (i,e., internal).

The probe 4 itself, as well as other internal parts of the imaging device 100 (not shown here), are connected to an interface unit 102 via a connector 105 at the proximal end of the device 100. The imaging console 101 and the interface unit 102 present together a control unit.

The interface unit 102 may include a motor drive (not shown) for rotating the imaging probe 4 at the distal end of the device 100 around the Z-axis. To this end, an internal torque transferring cable may be used, Probe rotation may be a requirement for some imaging probe embodiments, when a circumferential image of the entire imaging slice is needed. Alternatively, a miniature motor can be located at the distal end of the device 100, provided that it is compatible with the external static field environment, or is located outside the static field region. In such case, the interface unit 102 may include a driving circuitry for the miniature motor. Both alternatives are, of course, not necessary in imaging methods that do not require mechanical rotation of the imaging probe.

In addition, although not specifically shown, the interface unit 102 may also house some of the electronic modules of the system 1, such as amplification circuits for the receiving channel, matching networks for the transmitting/receiving channels, etc. The interface unit 102 is further connected to the external imaging console 101 via power and control cable 111, and via reception and transmission channel segments, 110 and 112, respectively. The external imaging console 101 comprises mostly a desktop personal computer (PC) 103 and a high-power transmission amplifier 104. The PC 103 controls the synchronized Emission pulse generation, signal acquisition, imaging probe rotation and φ-gradient activation, all being elements of the imaging process, which will be described further below. In addition, the PC 103 is used as a control station through which the operator interfaces with the system 1, and upon which monitor the image is displayed. The operation of the imaging console will be described further below.

Figure 2A:
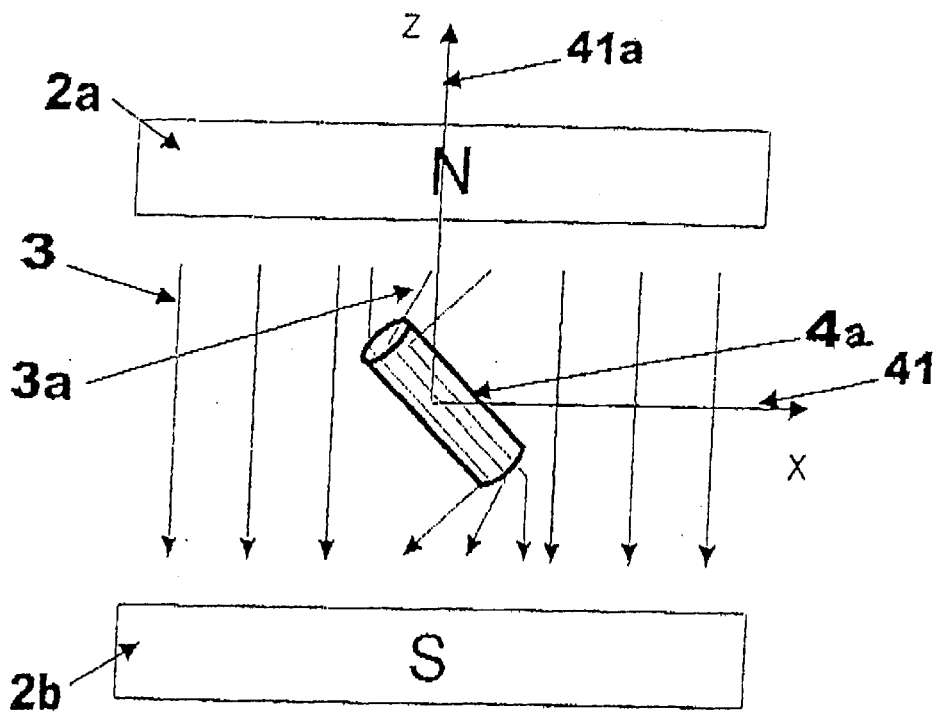
FIGS. 2A and 2B illustrate an example of a magnetic assembly suitable to be used in an imaging device of the system of FIG. 1.
Figure 2B:
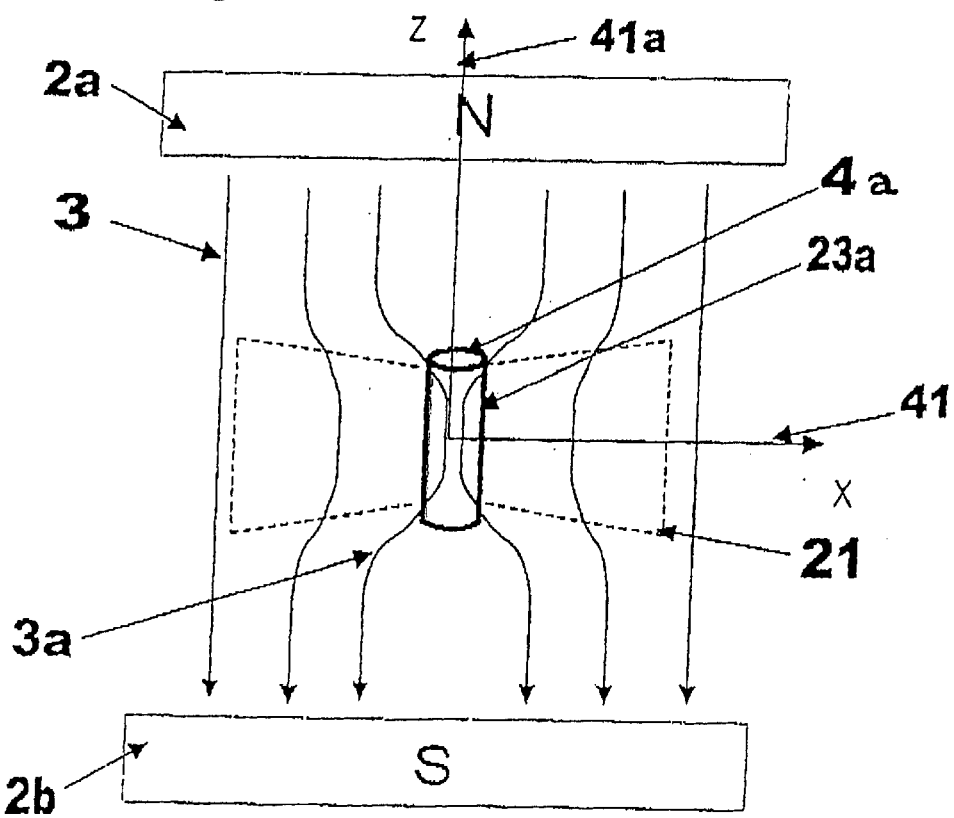

Reference is made to FIG. 2A and 2B illustrating one possible example of a magnetic assembly of the imaging probe 4 and used for deforming the static field 3. In the present example, only a field deforming assembly part 4a of the probe 4 is shown. The field deforming assembly 4a is a solid rod made from a ferromagnetic material, When the field-deforming assembly 4a is placed in the static field, the static field lines 3 are deformed to create the deformation pattern 3a.

As shown in FIG. 2A, for an arbitrary position and orientation of the rod 4a with respect to the external static field 3, the deformation pattern 3a can be very complex and hardly feasible for imaging purposes. However, as illustrated in. FIG. 2B, when the rod 4a is aligned with the external field flux lines 3 (i.e., the symmetry axis of the rod coincides with the Z-axis 41a defined by the general direction of the external magnetic field flux lines 3), the created deformation pattern 3a is also symmetric with respect to the Z-axis 41a.

Considering the static magnetic field along a radial extending away from the center of the rod 4a and across the imaging slice 21 (in the XZ-plane), the following should be noted. The deformed flux lines 3a are generally directed along the Z-axis. As one moves away from the rod 4a edge, the value of the static field intensity changes substantially from that measured on the rod 4a surface and up to its original value (i.e., the field strength prior to being deformed by the imaging probe 4).

Figure 3:
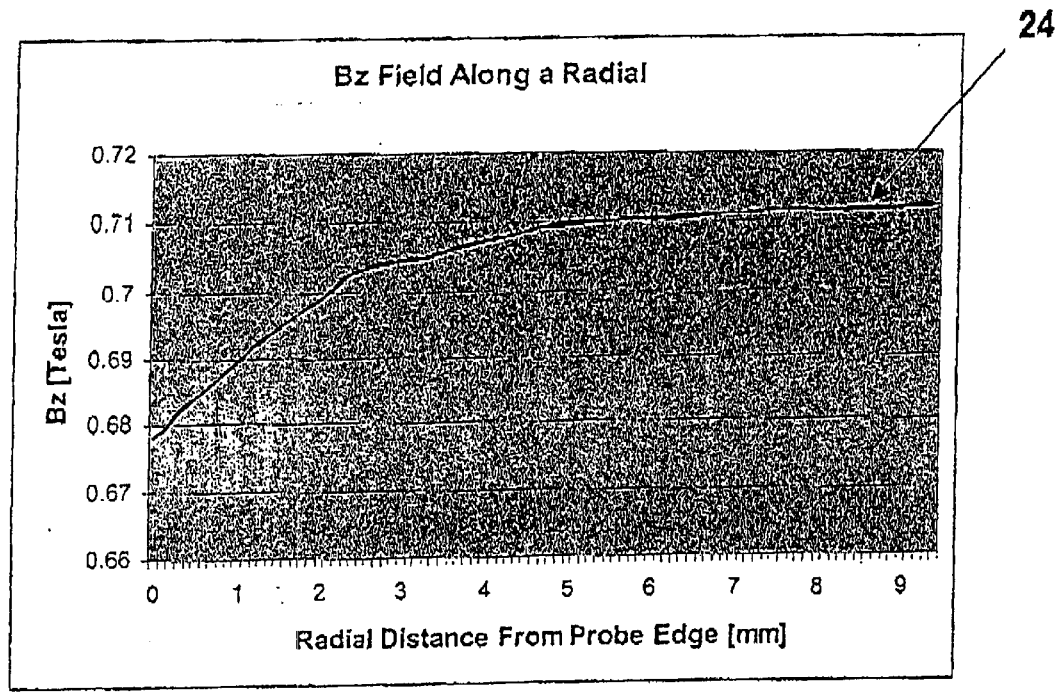
FIG. 3 illustrates the radial profile of a static magnetic field created by the magnetic assembly of FIGS. 2A–2B.

FIG. 3 illustrates a graph 24 showing the Z-component of the deformed static field ($B_0$) as measured at points along a X- (radial-) vector extending away from the rod edge 23a. In this example, the original field value is about 0.71T, and the rod is of 1 mm diameter and 5 mm length. It can be observed that the static field strength changes substantially with the increase of distance from the rod edge 2 3a. Over a distance of 10 mm, the field intensity changes from 0.68T to the original value of 0.71T, creating a substantial static magnetic field gradient $\alpha B_z/\alpha x$ of approximately 3T/m, demonstrating an imaging setting which is very unconventional in MRI. According to the present invention, this magnetic field gradient is employed to advantage for imaging purposes, as will be described more specifically further below.

It should be understood that the exact field profile 24 is a complex function of several parameters such as the ferromagnetic material of which the rod 4a is made, its exact shape and size, etc. The rod 4a can be made of iron powder, ferrite material, etc., having preferably large magnetic saturation values. In the example of FIG. 3, iron was used as the rod 4a material.

It should also be noted that the field profile 24 does not necessarily have to be linear In theory, any monotonic profile can be utilized for imaging, provided that the necessary corrections are made in the signal processing stage.

Figure 4:
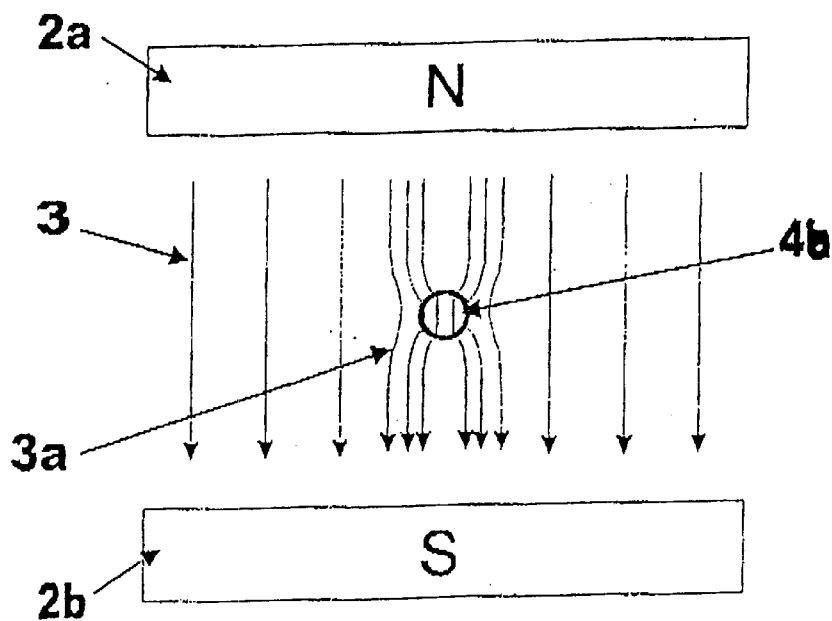
FIG. 4 illustrates another example of a magnetic assembly suitable to be used in the imaging device.

Turning now to FIG. 4, there is illustrated another possible example of a ferromagnetic field-deforming assembly. Here, a magnetic assembly is in the form of a solid ferromagnetic sphere 4b. When the assembly 4b is located in between the magnetic pole pieces 2a and 2b, the static field lines 3 are deformed to create a deformation pattern 3a in the vicinity of the magnetic assembly 4b. One advantage of using a sphere as the field deforming assembly is its symmetry for rotations: if the sphere-shaped field-deforming assembly 4b were rigidly connected to the probe device (not shown), then the deformation pattern 3a would be independent on changes in the device orientation relative to the external field 3.

Figure 5:
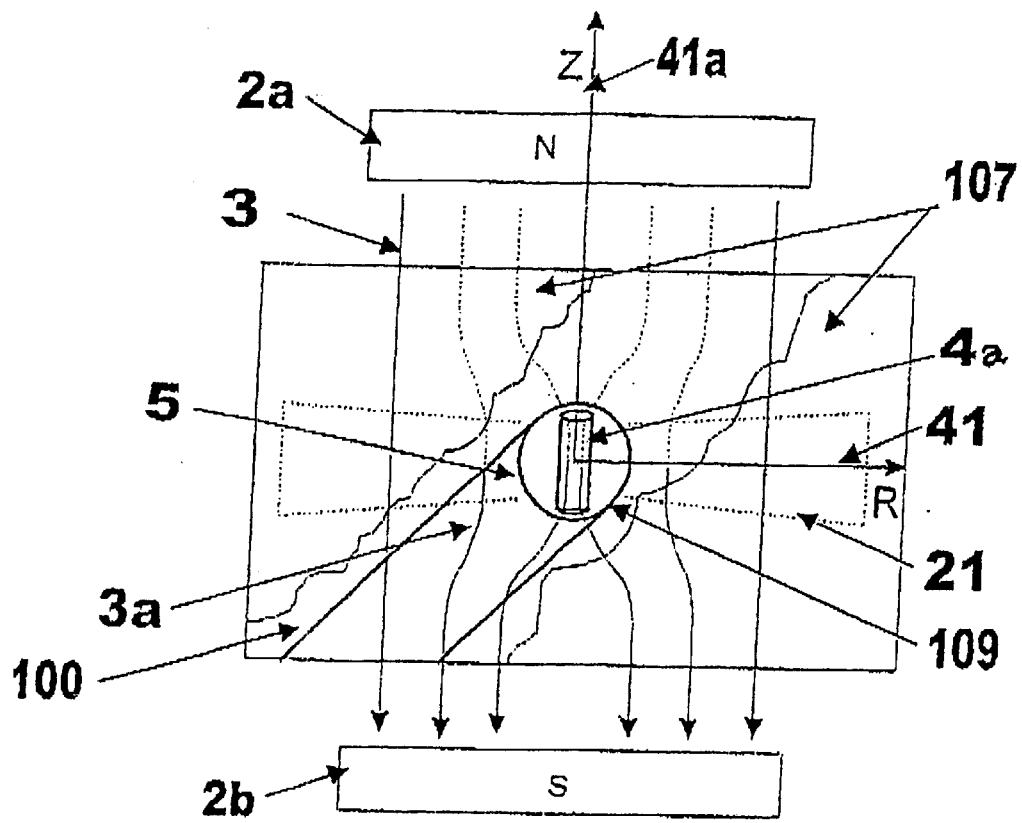
FIG. 5 illustrates how the independence of the magnetic field deformation pattern on the changes in the orientation a magnetic field assembly can be achieved with the assembly of FIGS. 2A–2B.

The same type of orientation independence can be achieved with the rod-shaped field-deforming assembly as well. As illustrated in FIG. 5, this is implemented by mounting the rod-shaped assembly 4a on a rotational assembly 5. The rotational assembly 5 allows the field-deforming assembly 4a to rotate freely around its center point, i.e., both to change the orientation of its symmetry axis and to rotate around this axis. It will be readily understood by the artisan that in such case the static magnetic field directed along the Z-axis 41a will create a force on the deforming assembly 4a, which will tend to align its symmetry axis with the Z-axis 41a. When the rotational assembly 5 is located at the probe section 109 of the imaging device (not shown), the device can be maneuvered freely with respect to the external field 3 without changing the deformation pattern 3a, except for its location, which follows the center of the field-deforming assembly 4a. When the probe section 109 of the imaging device is inserted into a body cavity, the deformed fields 3a, and therefore the imaging slice 21, extend into cavity walls 107, and create a static field gradient along the radial axis 41, which can be used to image the walls 107.

It will be readily understood by the artisan that the locally deformed field 3a can be created in principle by various other geometries and techniques, and is not limited to the use of a rod- or sphere-like ferromagnetic assembly. In addition, the given exemplary design, in which the static field deformation is independent of device orientation, is not a prerequisite for perform imaging, but can only serve to simplify the imaging process.

It should be emphasized here that since the deformation creates substantial variations in the local static field values (as can be seen in the graph of FIG. 3), then the non-homogeneity of up to a few percents of the static field is negligible in terms of its effect on the imaging quality. The technique of the present invention thus advantageously enables to obviate the amount of ingenuity and the cost related to creating homogeneous static magnetic fields to the degree of less than 1 part-per-million over large volumes.

To enable imaging of a region of interest with the imaging device according to the invention, the device is further provided with a time-varying magnetic field source (which is typically in the form of a transmission coil, and can be of any known design), and a receiver of NMR signals.

Figure 6:
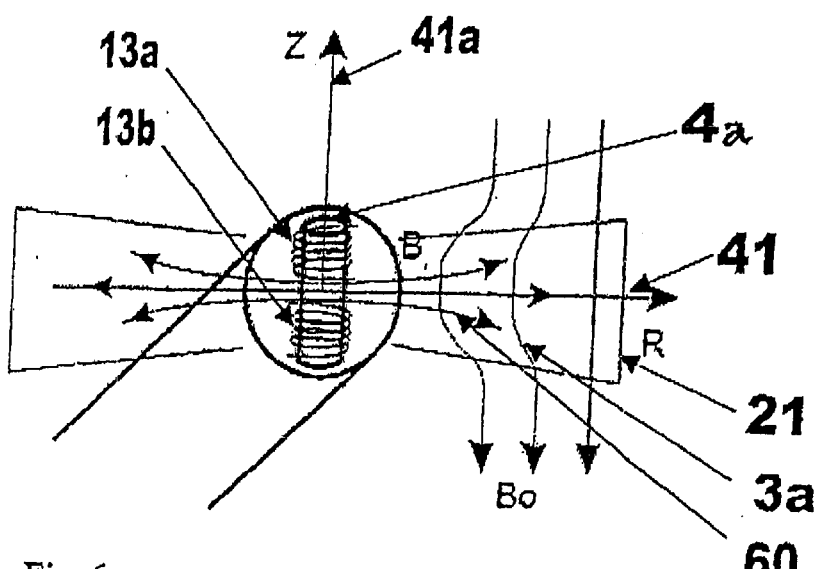
FIGS. 6 and 7 illustrate an imaging probe according to the invention utilizing the magnetic assembly of FIGS. 2A–2B and a transmission coil designed according to one possible example.
Figure 7:
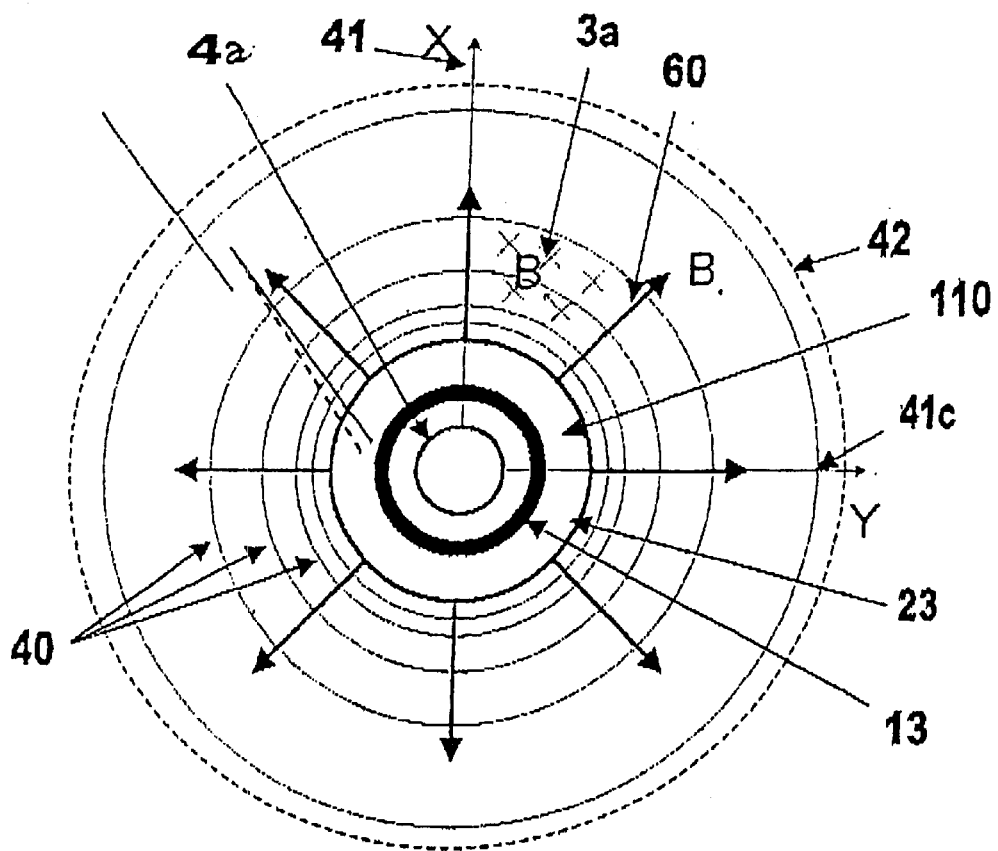

FIGS. 6 and 7 illustrate an imaging probe 110 utilizing the rod-shaped assembly 4a and a transmission coil of one possible design, which is known as the "opposed coil" configuration. Other device components, such as receiver coil and gradient coil, which may be incorporated in the imaging probe, are not shown for simplicity. The rod-shaped deforming assembly 4a is aligned with the Z-axis 41a direction. The deformed $B_0$ flux lines 3a in the imaging slice 21 are generally directed along the negative Z-axis 41a. Two solenoid-shaped coils 13a and 13b are wound in an opposed manner around the rod 4a, i.e., one coil 13a (or 13b) is wound as a right-hand helix, while the other coil 13b (or 13a) is wound as a left-hand helix. When RF current is driven through the coils 13a and 13b, a $B_1$ magnetic field is created with the flux lines 60. It can be observed that the $B_1$ flux lines 60 are generally perpendicular to the $B_0$ flux lines 3a, as required to efficiently excite the nuclei within the imaging slice 21.

FIG. 7 shows a cross sectional view of the imaging probe 110 in the XY-plane, the X- and Y- axes being marked 41 and 41c, respectively. Externally to the probe edge 23, the deformed $B_0$ lines 3a are sketched as perpendicular to the XY-plane. Contours 40 of the $B_0$-field in the XY-plane define regions of equal Z-component of $B_0$. Regions of a weaker field are located near the probe edge 23, while stronger field regions are located filer away from the probe edge 23. It can be observed that the spacing between the contours gets larger with increasing radial distance. This corresponds to non-linear radial profile of the $B_0$-field, which characterizes this specific example, and which drops from one level on the probe edge 23 to the original static field value. It can be observed that the opposed coil geometry creates a $B_1$ field pattern (i.e., $B_1$ flux lines 60), which is symmetrical with respect to rotation around the probe-axis (i.e., Z-axis). This allows the imaging slice to be symmetrical, as outlined by its borders in the XY-plane 42.

Figure 8:
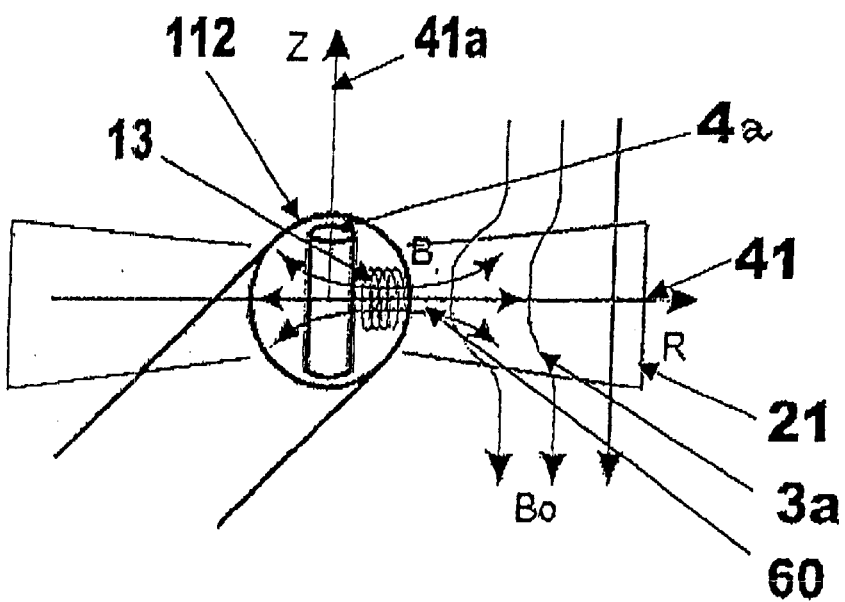
FIGS. 8 and 9 illustrate an imaging probe utilizing a transmission coil according to another example of the invention.
Figure 9:
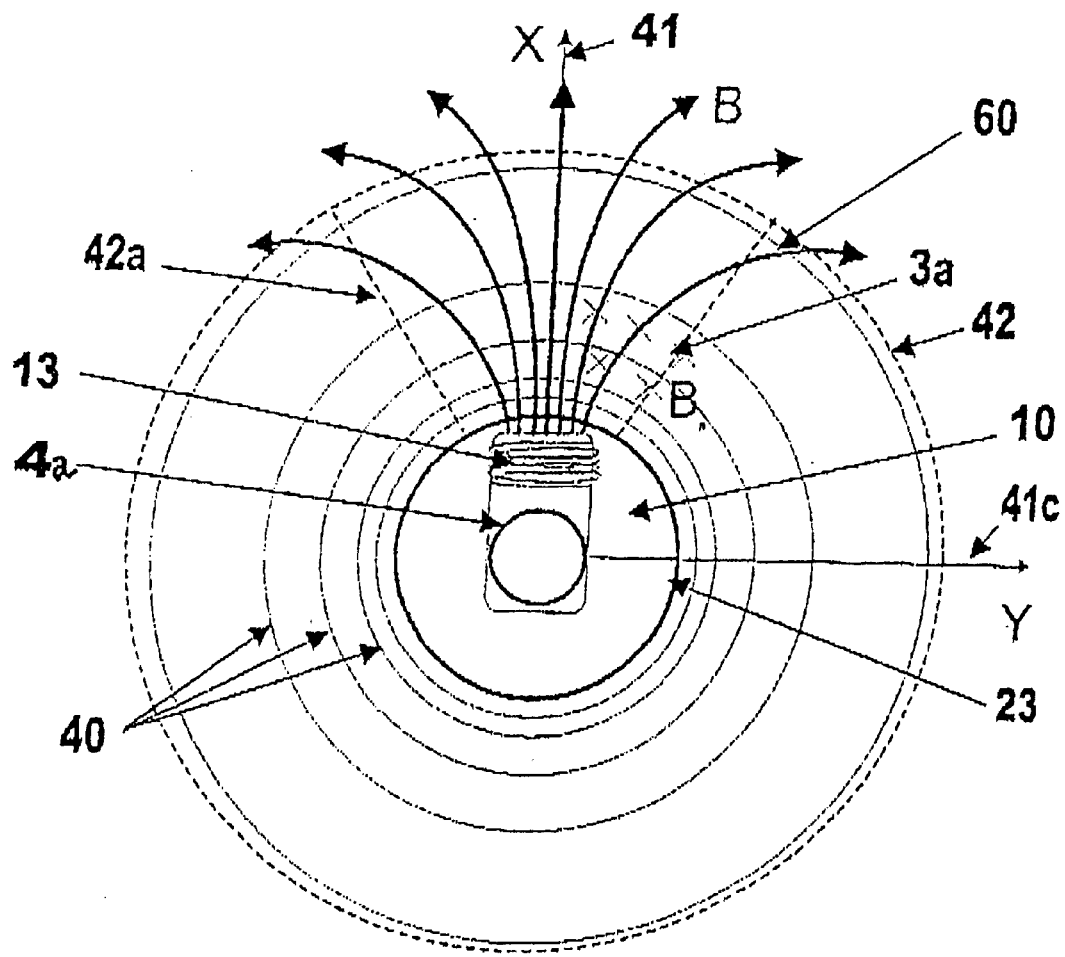

FIGS. 8 and 9 illustrate another example of an imaging probe 112 utilizing the transmission coil 13 with the so-called adjacent-coil geometry. Similarly, other probe components, such as receiver coil and gradient coil are not shown for simplicity. Here, the solenoid-shaped coil 13 is oriented with respect to the field-deforming assembly 4a such that the axis of the coil is perpendicular to the Z-axis 41a, i.e., the coil extends along the X-axis 41. The transmission $B_1$ field lines in the imaging slice 21 are directed substantially along the X-axis 41. Externally to the probe edge 23, the deformed $B_0$ lines 3a are sketched as perpendicular to the XY-plane. The contours of the $B_0$-field in the XY-plane are designated 40, and the $B_1$, flux lines are designated 60. It can be observed that the adjacent-coil geometry creates a $B_1$ field pattern, which is non-symmetrical with respect to rotation around the probe axis (Z-axis). This creates an imaging region (constituting an extended sub-region) which makes up only a sector of the imaging slice 42 in the XY-plane, as outlined by its borders 42a in the XY-plane.

Figure 10:
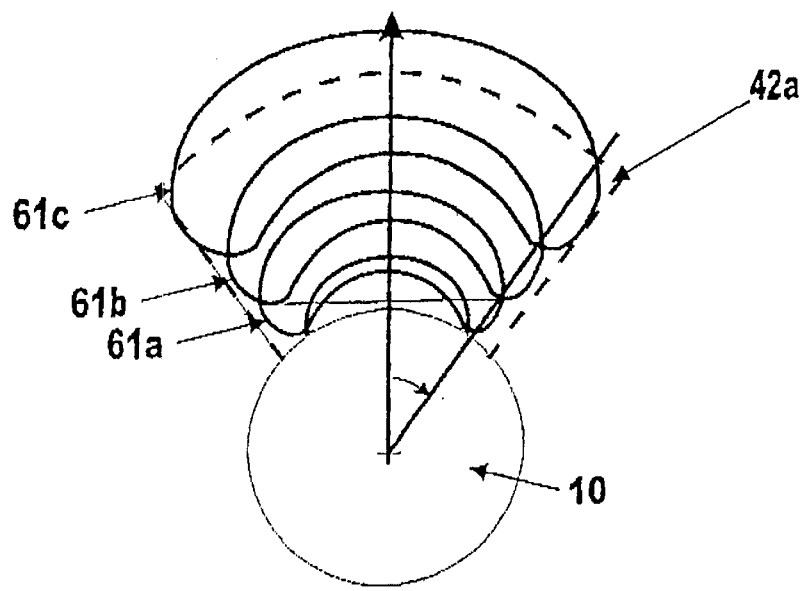
FIG. 10 illustrates an example of NMR signals excitation technique according to the invention, wherein a sector-shaped region of the region of interest is divided into sub-regions.

When an RF pulse is driven into the transmission coil 13, a traverse oscillating field 60 is created, which excites the spins that have a resonance frequency corresponding to the pulse frequency. If a substantially short RF pulse is used for excitation, the spins of a relatively wide band of resonance frequencies are excited, i.e., a volume of spins which extends substantially along the X-axis. The ability to effectively excite nuclei with resonance frequencies which vary substantially from the center frequency of the transmission pulse is, however, limited, and therefore the region of effectively excited nuclear spins in the sector-shaped region 42a can be generally delineated as a "banana"-shaped sub-region. The such typical "banana"-shaped sub-regions are shown in FIG. 10 as 61a, 61b and 61c.

By varying the center frequency of the transmission pulse, a different "banana"-shaped sub-region of excitation can be selected: According to the field profile example of FIG. 3, a lower center frequency pulse excites a sub-region of the imaging sector located closer to the probe edge 23, while a higher frequency pulse excites a sub-region farther away from the probe edge 23. Thus, three banana-like sub-regions 61a, 61b and 61c are sequentially activated by varying the center frequency of the transmission pulse. The pulse width (or shape in general) controls the radial extent of the sub-region: A narrower pulse in the time domain will excite a wider sub-region, as long as the excitation energy of the pulse remains sufficient for the required magnetization tilt angle.

It should be understood that the system components described above are sufficient to perform pseudo-one-dimensional imaging of samples external to and adjacent to the probe. When a patient, or a specific organ to be imaged, is positioned in the external static magnetic field, the imaging device 100 is maneuvered such that the imaging probe 4 (i.e., probe section 109 of the imaging device) is located adjacent to the imaged sample, and such that the X-axis 41 traverses the sample in one dimension.

Figure 11:
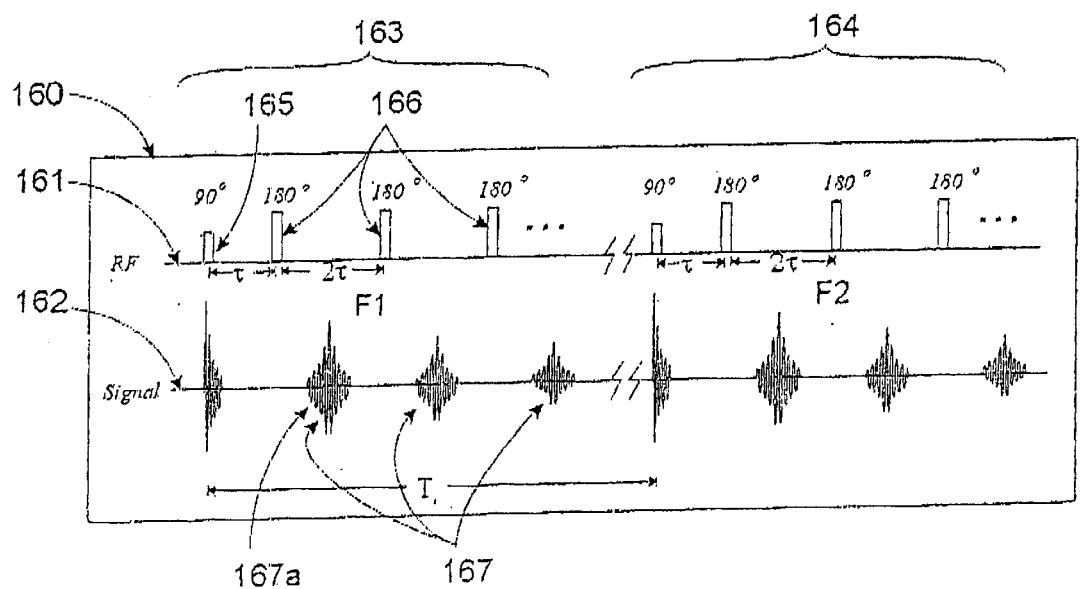
FIG. 11 illustrates an example of a one-dimensional imaging sequence suitable to be used in the present invention, which is based on a variant of the Carr-Purcell-Meiboom-Gill (CPMG) sequence.

An exemplary imaging method, which may be used in accordance with the present invention, is based on a sequence illustrated in. FIG. 11, which is a variant of the Carr-Purcell-Meiboom-Gill (CPMG) sequence. The terminology and graphical method used to describe this sequence is known per se, and therefore need not be specifically described. A graph 161 presents the time-base envelope of the transmitted RF pulses used to excite the nuclei. A graph 162 is a qualitative sketch of the expected magnetic resonance signal. Preferably, a series 163 of wide-band (or "hard") RF pulses is used to simultaneously excite nuclei in one sub-region (61A in FIG. 10) of the imaging sector (42a in FIG. 10), so as to obtain a series of spin-echoes 167. This sub-region is selected by setting the RF frequency of the pulses 165 and 166 to a value representing the typical resonance frequency $F_1$ of nuclear spins in that sub-region. One alternative for obtaining the spin-echoes 167 is the transmission of a 90° RF pulse 165 followed by a series of 180° RF pulses 166, using the time delays given in graph 161.

It should, however, be noted that numerous other excitation schemes are applicable for obtaining a series of spin-echoes 167, and can therefore be used for the purposes of the present invention. Sequences based on magnetization tilt angles different than 90° and 180°, on stimulated echoes, and on variations in pulse timing and phase are few examples of many different sequences well known in the art which can be used in accordance with the present invention.

The spin-spreading, which is rephased at each echo center, stems predominantly from the strong X-gradient in the static magnetic field, which exists permanently in the imaging sector (42a in FIG. 10). Turning back to FIG. 3, this is gradient can be estimated in the given example at around 3T/m, corresponding to an overall magnetic resonance frequency range of about 29MHz–30 MHz for nuclei in the imaging slice of a 10 mm radial dimension.

It is thus evident that the method according to the invention enables to simultaneously operate within a substantially wide frequency bandwidth of the magnetic resonance signals with respect to the mean frequency value. In the present example, the overall frequency bandwidth is approximately 3% of the center frequency.

It will be understood that one-dimensional (1-D) spin-density profiles of the imaging sector 42a can readily be obtained by sampling the echo signal (167a in FIG. 11, for example), using typical τ values and acquisition window sizes of several microseconds, and transforming it using a simple Fourier transform. The fact that the static magnetic field profile (24 in FIG. 3) is not perfectly linear can be readily compensated for during post-processing.

The relatively short τ values make possible the acquisition of typically a few hundreds of spin-echoes 167 in one excitation series 163, having duration of a typical transverse relaxation time ($T_2$). The multiplicity of spin-echoes 167 acquired can be averaged prior to any transformation in order to improve the signal-to-noise ratio (SNR) and, as a result, the quality of the final image.

Signal acquisition is preferably done by sequential excitation of several sub-regions of the imaging slice. When signal acquisition from one such sub-region is completed, the next sub region can be acquired by repeating the above pulse burst 163 using a new pulse burst 164 with a different center frequency ($F_2$) in the transmitted pulses By properly designing the order of excited sub-regions and by shaping the RF pulses, one can make sure that excitation of one sub-region produces little or ineffective excitation of neighboring sub-regions. Therefore, sequential excitation of sub-regions can be carried out without the requirement that the period of burst repetition $T_F$ be greater than $T_1$. In other words, this procedure allows for acquiring a complete set of sub-regions covering the entire imaging sector 42*a* in one $T_1$ time frame.

It should be noted that a proper calibration of the received echo signals is required as part of tile signal processing algorithm, since it will be understood by the artisan that the signal corresponding to each frequency component of the echo is a complex function involving the relative volume of spins with corresponding resonance frequency, the transmission effectiveness and reception sensitivity typical to that volume, etc. These calibrations can be readily designed and carried out by the artisan so that the obtained profile correctly represents the spin density (or any other NMR parameter) distribution along the radial vector.

In accordance with the present invention, several methods are available for obtaining two-dimensional (2-D) images of the imaging slice 42. In the present example, a technique of a type utilizing an integrated φ-gradient coil, and one exemplary such coil design will be described. Alternative coil designs are given, for example, in the above-indicated U.S. Pat. No. 5,572,132. The design described below, however, is simpler in the sense that it controls the gradient profile over the imaging sector 42*a* alone.

Figure 12:
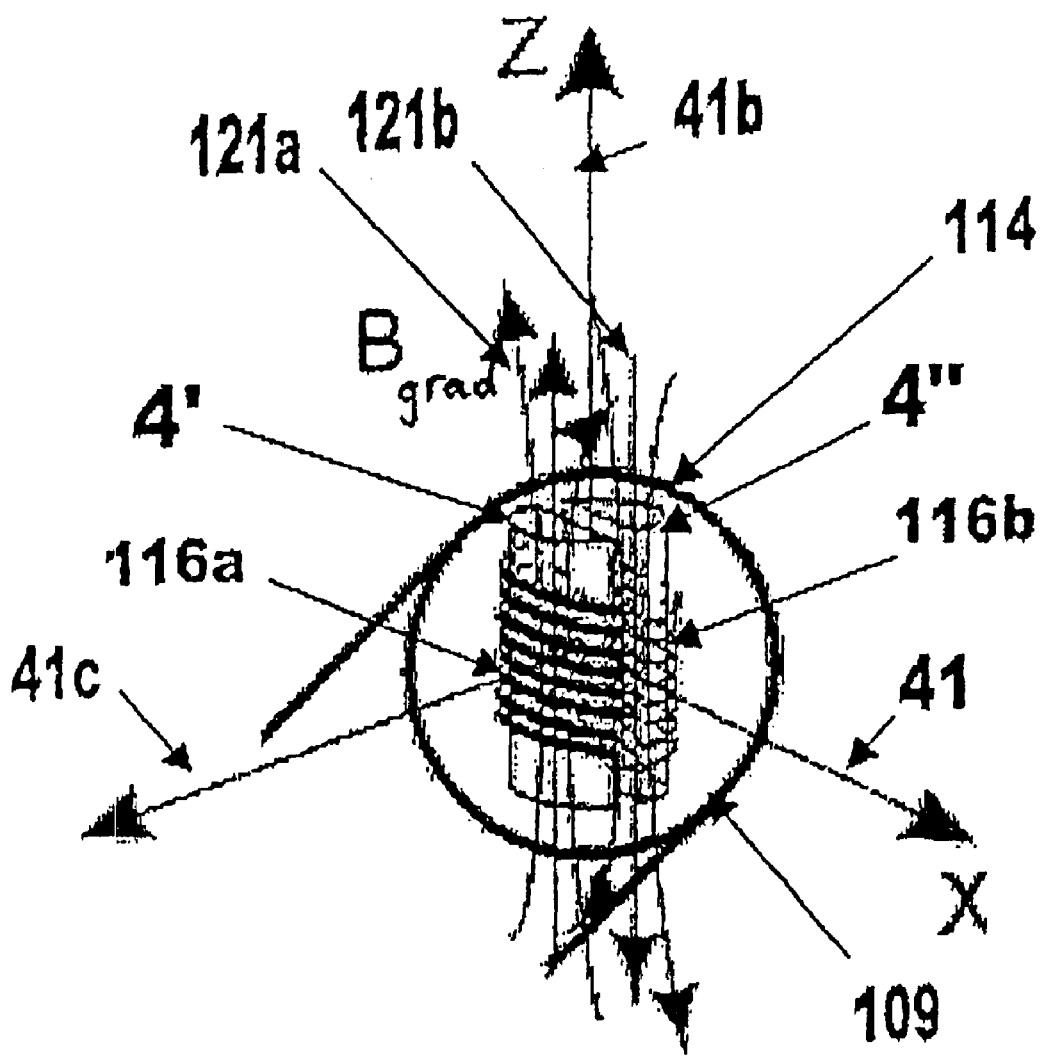
FIGS. 12 and 13 illustrate an imaging probe utilizing a gradient coil assembly located adjacent to the transmission coil of FIGS. 8–9.
Figure 13:
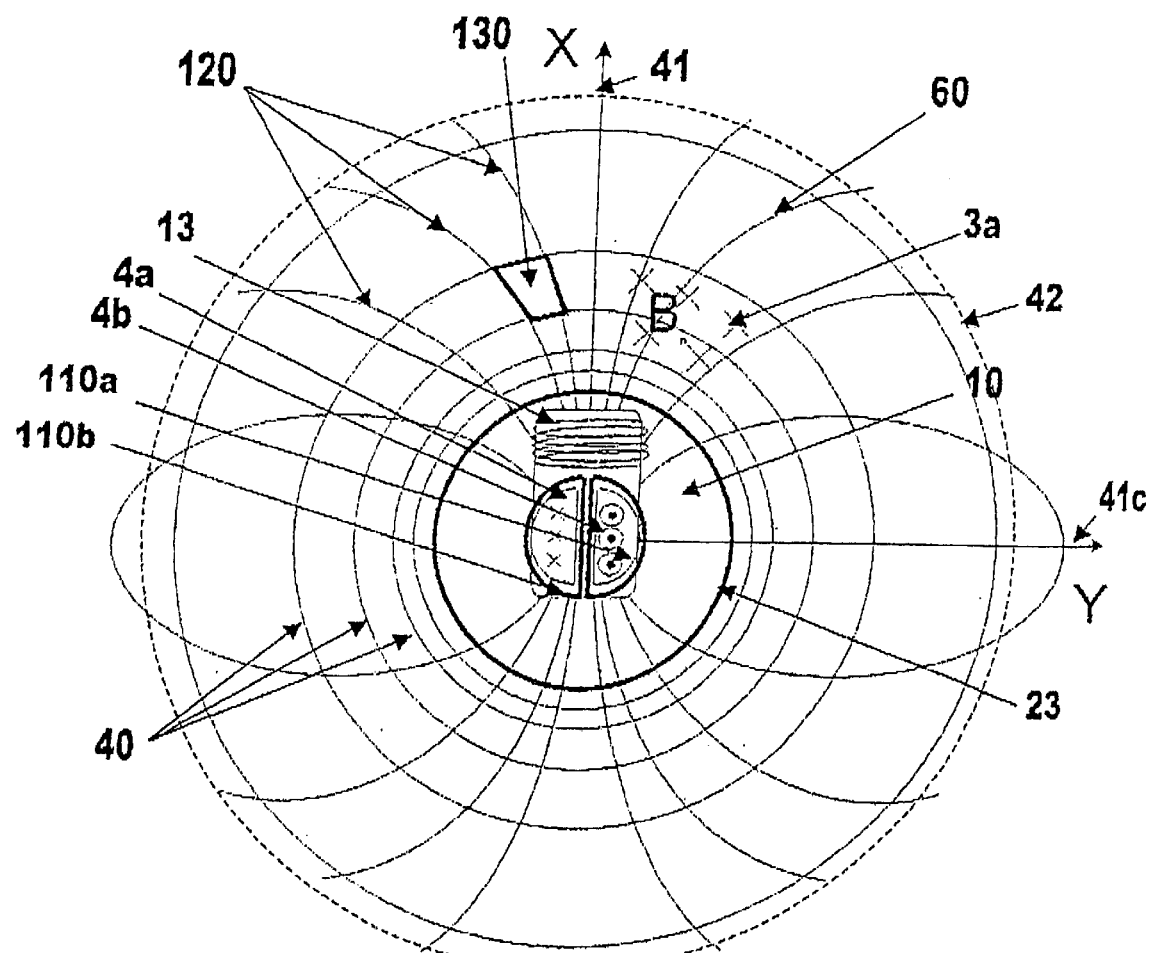

FIGS. 12 and 13 illustrate an example of a probe device 114 utilizing a gradient coil assembly composed of two wound gradient coils 116*a* and 116*b* located adjacent to the transmission coil (not shown for simplicity). In this example, the field-deforming magnetic assembly 4*a* is cut into two half-cylinders 4' and 4", upon which the two gradient coils 116*a* and 116*b* are wound in an opposed manner, i.e., one coil forms a right-hand helix, while the other forms a left hand helix. The two half-cylinders 4' and 4", which are made of a ferromagnetic material, when being placed in the Z-directed static magnetic field (not shown), align with the field, i.e., are parallel to the Z-axis 41*a*. Now, if current is driven through the windings of the coils 116*a* and 116*b*, a field delineated by the flux lines 121*a* and 121*b* is created. Considering the XZ-plane as the plane dividing the deforming assembly 4*a* into the part 4' and 4", the gradient field (created by driving the current into the coils 116*a* and 116*b*), when measured in the XY-plane, is directed substantially in the +/−Z direction, and is anti-symmetric with respect to the X-axis 41. In other words, the strength of the created magnetic field is an anti-symmetric function of the φ-coordinate, as delineated by the contours 120. Thus, a φ-gradient $$\frac{\partial B_Z}{\partial \phi}$$

It should be noted that the winding of the gradient coils 116*a* and 116*b* around the half cylinders 4' and 4", which are used also as a field-deforming assembly, is described as one possible example only. Generally, any gradient coil configuration, which can create variable and monotonic field strength in the angle dimension in the imaging sector 42*a* or slice 42, can be used. The ferrite half cylinders 4' and 4" were used here only to improve the efficiency of the gradient field by concentrating the magnetic flux lines in the ferrites and therefore improving the field intensity per unit current driven in the coils 116*a* and 116*b*.

Figure 14:
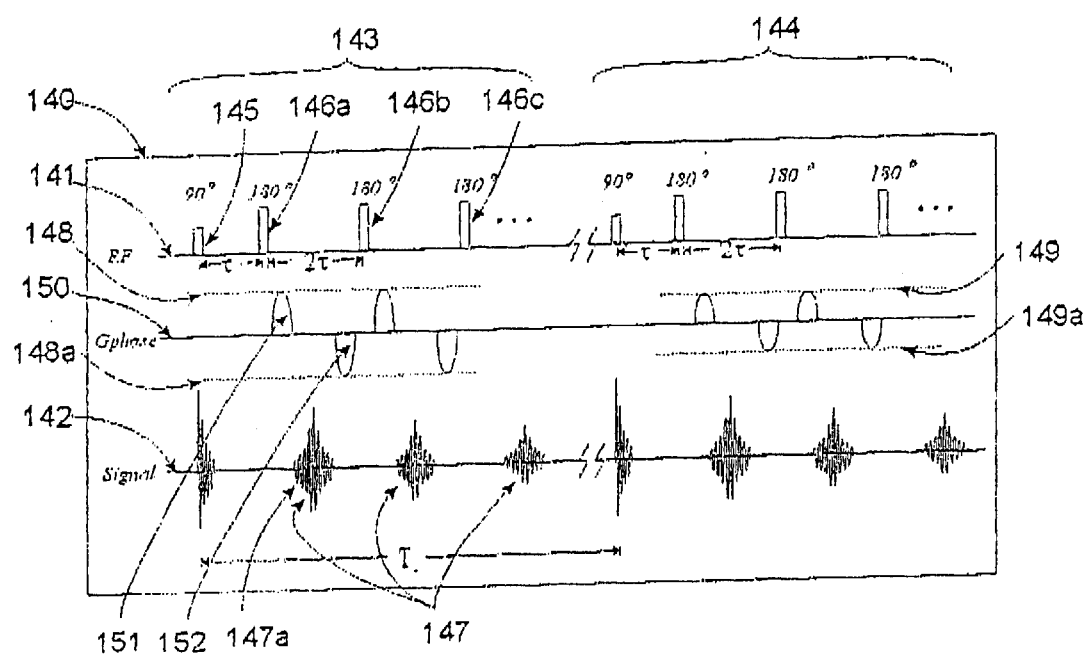
FIG. 14 illustrates an example of a two-dimensional imaging sequence suitable to be used in the present invention based on the one-dimensional sequence of FIG. 11.

It should be understood that a great variety of known two-dimensional imaging sequences could be used in the present invention. Referring to FIG. 14, there is illustrated an example of a sequence suitable to be used for these purposes based on the above described one-dimensional sequence (FIG. 11). Here, transmission RF pulse envelopes are designated 141, a received signal is designated 142, and gradient pulses are designated 150. In this case, RF pulse bursts 143 and 144 are transmitted using the same center frequency. Gradient pulses are transmitted in pairs in between every two 180°-pulses 146, before and following each spin-echo 147 signal acquisition segment.

The first (positive) gradient pulse 151 follows the first 180°-pulse 146*a* and phase-encodes the spins in the φ-direction. The phase-encoded echo 147*a* is then acquired. The second (negative) gradient pulse 152 reverses the phase shifts generated by the first gradient pulse 151, prior to the next 180°-pulse 146*b*. The gradient pulse levels 148 and 148*a* remain constant throughout each pulse burst 143, and the echoes acquired during this burst can be averaged for improved SNR. During the next pulse burst 144, the gradient pulse levels 149 and 149*a* are changed and the process is repeated. By repeating the process with N different (and preferably linearly varying) gradient levels, a scan of K-space in two dimensions is (radial and φ) can be achieved. By applying a two-dimensional Fourier transform with appropriate weighting and calibrations, a two dimensional image of the sample in a single sub region 61 of the imaging sector 42*a* can be obtained Referring again to FIG. 13, there are illustrated "raw" pixels in this two-dimensional image in the XY-plane. The contours of the gradient field are marked 120 and the static $B_0$ field contours marked by 40. A "raw" image pixel 130 is defined by two consecutive $B_0$ contours in the first (radial) dimension and by two consecutive gradient field contours in the second (φ) dimension. This pixel 130 is actually the so-called "raw" pixel, since it will eventually need to be translated by interpolation and calibration into more conventional polar coordinates R and φ.

One of alternative methods for obtaining lateral (φ) separation can be based on "destructive sharpening" of the sub-region in the φ-dimension. This technique is disclosed in, a co-pending application assigned to the assignee of the present application. Generally, this technique utilizes a φ-gradient coil design, which produces a substantial magnetic field in regions of large (absolute) φ-values. These substantial fields can be used for creating destructive dephasing of spin-echo components coming from nuclear spins in regions of large (absolute) φ-values. Spins located at $|\phi|>\Delta\phi_0$ are intentionally dephased, in contrast to spins located at $|\phi|<\Delta\phi_0$, wherein $2\Delta\phi_0$ is the required angular resolution.

Another alternative for obtaining lateral (φ) separation obviates the need for a φ-gradient coil, and utilizes processing of phase variations in the received signals acquired from overlapping imaging sectors 42a, as the imaging probe is rotated around the Z-axis.

As for the receiver coil, several alternative embodiments are possible. One alternative is to use any of the transmission coil geometries for reception. Another is to use any of the coil geometries described in a co-pending application assigned to the assignee of the present application. In general, there is a large variety of coil geometries, which can be used for signal reception, with the general preference that the sensitive region defined by the receiver coil overlaps with the excited region, i.e., the extended sub-region of the imaging slice, and that sufficient sensitivity is reached over the wide frequency band associated with the substantially non-homogeneous field produced in vicinity to the field deforming assembly (4a or 4b).

Turning back to FIG. 1, the system 1 according to the invention operates in the following manner. The operator initiates the image acquisition process by running the imaging sequence and collecting received signals, while the imaging probe is rotated. Transmission pulses are generated at low level voltages by specific hardware located in the PC 103 of the imaging console 101. Then, the pulses are amplified by the high-power amplifier 104, and driven via transmission channel segment 112 and the interface unit 102 into the transmission channel in the catheter 100 itself Gradient pulses are generated by the gradient generator module 113 as required by the sequence imaging on the PC 103 and are driven into the gradient channel (not shown) in the imaging device 100. Received NMR signals are amplified by the interface unit 102 and transferred via the receiver channel segment 110 into data acquisition hardware (not shown) in the PC 103. Acquired data is stored and processed in real time in the PC 103 memory.

At the end of the acquisition phase, the data is processed to produce a high-resolution image of a cross section of the vessel walls 107 contained in the imaging slice 21, which can be displayed on the PC 103 monitor. Multiple cross-section images can readily be collected by moving the imaging probe section 109 along the Z-axis.

It should be noted, although not specifically shown, that the same can be achieved by using an array or "stack" of imaging probes aligned along the Z-axis, or mounted along a flexible pin-like support, as the case may be. The series of cross-section images obtained by either of the above techniques can be further processed to reconstruct 3-D images of the vessel.

In accordance with the present invention, the MRI probe enables imaging of a blood vessel from within the vessel lumen, or the walls of any cavity or surface of the human body, or in any other industrial application. Adaptation of the invention for a specific application can be done by variations in most all of the imaging probe characteristics. Additionally, the imaging method can be varied in accordance with the imaging requirements of the specific application.

The advantages of the present invention are thus self-evident. The imaging device according to the invention utilizes a field deforming assembly that creates substantially strong but local static field gradients in its surroundings. The present invention utilizes sufficiently effective wideband transmission coil and channel, sufficiently effective gradient coils, sufficiently strong static field and static field gradient, and efficient method for the acquisition of multiple short spin-echoes in a short period of time.

The present invention enables to operate with extremely non-homogeneous static magnetic fields created in an extensive ROI external to the probe, and altogether to obtain a high-resolution image of the ROI in a short period of time. The non-homogeneity of the static magnetic field allows for advantageous use of more extremely multiple echo averaging for imaging purposes, and for improving the detection of signals originating from nuclei in materials having relatively short $T_2$ values. Operating in a wide frequency band allows very lenient restrictions on the external static field homogeneity, which may result in much simpler and lower cost equipment. The provision of the strong gradients enables to significantly improve the image resolution. Combination of the strong static field gradient inherent in the assembly, together with the integrated gradient coils and rotational motion of the imaging probe allow separation in both radial and angular dimensions and the creation of two-dimensional images in the plane perpendicular to the probe axis.

What is claimed is:

1. A magnetic assembly for use in an MRI system, which utilizes a first magnetic field source creating a static magnetic field of a certain profile and a second magnetic field source producing a time-varying magnetic field, the magnetic assembly comprising a passive magnetic element which, when accommodated within the static magnetic field, affects the static magnetic field profile in a well-defined manner without creation of any additional magnetic field, to thereby cause creation of a high-gradient static magnetic field region in the vicinity of the magnetic assembly, thereby enabling imaging of a medium located within said high-gradient static magnetic field region by exciting nuclei spins in said region with the time-varying magnetic field.

2. The magnetic assembly according to claim 1, wherein said passive magnetic element is a rod-like shaped element, the high-gradient static magnetic field region being in the form of a slice surrounding the rod-like magnetic element.

3. The magnetic assembly according to claim 2, and also comprising a rotational assembly for supporting said rod-like element to allow its freely -rotation around its center point.

4. The magnetic assembly according to claim 1, wherein said passive magnetic element is a sphere-like shaped element, the high-gradient static magnetic field region being in the form of a slice surrounding the sphere-like element.

5. An MRI system comprising:
   a first magnetic field source creating a first static magnetic field of a certain profile,
   a magnetic assembly comprising a passive magnetic element which, when being accommodated within the static magnetic field, affects the static magnetic field profile in a well-defined manner without creation of any additional magnetic field to thereby create a high-gradient static magnetic field region in the vicinity of the magnetic assembly, a field of view of the MRI system being defined by said high-gradient static magnetic field region,
   a second magnetic field source operable to create a second time-varying magnetic field within said first static magnetic field to excite nuclei in a medium to which said second time-varying magnetic field is applied and thereby generate NMR signals, and
   a receiver for receiving the NMR signals and generating data indicative thereof.

6. The system according to claim 5, wherein said magnetic assembly is movable within the static magnetic field region.

7. The system according to claim 5, wherein said passive magnetic element is a rod-like shaped element, the high-gradient static magnetic field region being in the form of a slice surrounding the rod-like magnetic assembly.

8. The system according to claim 7, wherein said magnetic assembly comprises a rotational assembly for supporting said rod-like element so as to allow its freely rotation around its center point.

9. The system according to claim 7, wherein said passive magnetic element is a sphere-like shaped element, the high-gradient static magnetic field region being in the form of a slice surrounding the sphere-like element.

10. The system according to claim 5, wherein the gradient of the static magnetic field in the high-gradient region allows a wide frequency band of the time-varying magnetic field to enable simultaneous excitation of nuclei spins in at least a part of high-gradient static magnetic field region characterized by a frequency bandwidth of 1% and more than a mean value of a magnetic resonance frequency for the nuclei spins in said at least part of the high-gradient region, the system thereby enabling acquisition of up to a few thousands of spin-echo signals in one excitation series having duration of a typical transverse relaxation time ($T_2$).

11. The system according to claim 5, wherein the time-varying magnetic field source comprises at least one radio-frequency transmitting coil wound onto said passive magnetic element said at least one transmitting coil exciting nuclei spins within said high-gradient static magnetic field region in the form of a slice surrounding the magnetic assembly.

12. The system according to claim 5, wherein the time-varying magnetic field source comprises at least one radio-frequency transmitting coil mounted adjacent to said magnetic assembly, the at least one radio-frequency transmitting coil thereby exciting nuclei spins in a sector-shaped region of said high-gradient static magnetic field region, which is in the form of a slice surrounding the magnetic assembly.

13. An imaging device for use with an external magnetic field source that creates a static magnetic field of a certain profile, the device comprising:

a magnetic assembly comprising a passive magnetic element which, when accommodated within said static magnetic field, affects the static magnetic field profile in a well-defined manner without creating any additional magnetic field to thereby cause creation of a high-gradient magnetic field region in the vicinity of the magnetic assembly;

a magnetic field source for creating a time-varying magnetic field, which, when being applied to a medium located within the static magnetic field region, is capable of exciting nuclei spins in at least a part of said high-gradient region to generate NMR signals; and a receiver for receiving the NMR signals and generating data indicative thereof.

14. The device according to claim 13, wherein said passive magnetic element is a rod-like shaped element, the high-gradient static magnetic field region being in the form of a slice surrounding the rod-like magnetic element.

15. The device according to claim 14, wherein said magnetic assembly comprises a rotational assembly for supporting said rod-like element to allow its freely rotation around its center point.

16. The device according to claim 13, wherein said passive magnetic element is a sphere-like element, the high-gradient static magnetic field region being in the form of a slice surrounding the sphere-like element.

17. The device according to claim 13, wherein the gradient of the static magnetic field in the high-gradient region allows a wide frequency band of the time-varying magnetic field source to enable simultaneous excitation of nuclei spins in at least a part of the high-gradient static magnetic field region characterized by a frequency bandwidth of 1% and more than a mean value of a magnetic resonance frequency for the nuclei in said region, the system thereby enabling acquisition of up to a few thousands of spin-echo signals in one excitation series having duration of a typical transverse relaxation time ($T_2$).

18. The device according to claim 13, wherein the time-varying magnetic field source comprises at least one radio-frequency transmitting coil wound onto said passive magnetic element, said at least one transmitting coil exciting nuclei within said high-gradient region in the form of a slice surrounding the passive element.

19. The device according to claim 13, wherein the time-varying magnetic field source comprises at least one radio-frequency transmitting coil mounted adjacent to said passive magnetic element, the coil thereby exciting nuclei in a sector-shaped region of said high-gradient region in the form of a slice surrounding the passive element.

20. The device according to claim 13, comprising a probe portion containing at least said magnetic assembly.

21. An MRI system comprising an external magnetic field source that creates a static magnetic field of a certain profile, an imaging probe device, and a control unit for receiving and analyzing data generated by the probe device to create images of a region of interest in a medium, wherein said imaging probe device comprises:

a probe portion having a magnetic assembly comprising a passive magnetic element which, when accommodated within said static magnetic field, affects the static magnetic field profile in a well-defined manner and without producing an additional magnetic field to thereby create a high-gradient static magnetic field region in the vicinity of the probe portion;

a magnetic field source for creating a time-varying magnetic field, which, when being applied to the static magnetic field region, is capable of exciting nuclei spins in the medium within at least a part of said high-gradient static magnetic field region to generate NMR signals; and a receiver for receiving the NMR signals and generating data indicative thereof.

22. The system according to claim 21, wherein said passive magnetic element is a rod-like shaped element, the high-gradient static magnetic field region being in the form of a slice surrounding the rod-like magnetic element.

23. The system according to claim 22, wherein said magnetic assembly comprises a rotational assembly for supporting said rod-like element so as to allow its freely rotation around its center point.

24. The system according to claim 21, wherein said passive magnetic element is a sphere-like element, the high-gradient static magnetic field region being in the form of a slice surrounding the sphere.

25. The system according to claim 21, wherein the gradient of the static magnetic field in the high-gradient region allows a wide frequency band of the time-varying magnetic field source to enable simultaneous excitation of nuclei spins in the medium within said at least part of the high-gradient region characterized by a frequency bandwidth of 1% and more than a mean value of a magnetic resonance frequency for the nuclei, the system thereby enabling acquisition of up to a few thousands of spin-echo signals in one excitation series having duration of a typical transverse relaxation time ($T_2$).

26. The system according to claim 21, wherein the time-varying magnetic field source comprises at least one radio-frequency transmitting coil wound onto said passive element, said at least one transmitting coil exciting nuclei within the high-gradient region in the form of a slice surrounding the passive element.

27. The system according to claim 21, wherein the time-varying magnetic field source comprises at least one radio-frequency transmitting coil mounted adjacent to said passive element, the coil thereby exciting nuclei in a sector-shaped region of the high-gradient region in the form of a slice surrounding the passive element.

28. A method for magnetic resonance imaging of a region of interest in a medium, said region of interest lying within a static magnetic field of a certain profile, the method comprising the steps of:
   (i) affecting the profile of said static magnetic field in a well-defined manner and without creation of an additional magnetic field to thereby create a high-gradient static magnetic field region in the region of interest and define an imaging dimension along the high-gradient region;
   (ii) applying a time-varying magnetic field to at least a part of said high-gradient static magnetic field region to excite nuclei -spins therein for generating NMR signals;
   (iii) receiving the NMR signals and generating data indicative thereof;
   (iv) analyzing the generated data to obtain an image of said region of interest.

29. The method according to claim 28, wherein said affecting of the static magnetic field profile is such as to cause deformation of the profile of the static magnetic field, which can be used as a gradient field for imaging.

30. The method according to claim 28, wherein the time-varying magnetic field has a wide frequency band to enable simultaneous excitation of nuclei spins in the medium characterized by a frequency bandwidth of 1% and more than a mean value of a magnetic resonance frequency for the nuclei, thereby enabling acquisition of up to a few thousands of spin-echo signals in one excitation series having duration of a typical transverse relaxation time ($T_2$).

31. The method according to claim 28, wherein said at least part of the high-gradient static magnetic field region is in the form of a sector of a slice-like region surrounding the magnetic assembly, the excitation of the nuclei in said sector by said time-varying magnetic field comprising the step of:
   generating short transmission pulse bursts of sufficient power, thereby exciting successive sub-regions of said sector, each of the successive sub-regions including nuclei corresponding to a narrower resonance frequency band, as compared to that of the entire sector, the carrier frequency of each transmission pulse burst being selected according to a specific resonance frequency of the nuclei residing in the corresponding sub-region of the sector.

32. The method according to claim 28, and also comprising the step of creating an additional imaging dimension of the region of interest.

33. The method according to claim 32, wherein the additional imaging dimension is created by means of an angular coordinate varying magnetic field applied to at least a part of said high-gradient static magnetic field region.

* * * * *